INVENTORS
GORDEN W. NEFF
HANNON S. YOURKE
BY [signature]
ATTORNEY

Sept. 28, 1965 G. W. NEFF ETAL 3,209,158

TUNNEL DIODE SHIFT REGISTERS

Filed Feb. 8, 1960 3 Sheets-Sheet 2

United States Patent Office 3,209,158

Patented Sept. 28, 1965

3,209,158

TUNNEL DIODE SHIFT REGISTERS

Gordon W. Neff, Mahopac, and Hannon S. Yourke, Peekskill, N.Y., assignors to International Business Machines Corporation, New York, N.Y., a corporation of New York Filed Feb. 8, 1960, Ser. No. 7,333

9 Claims. (Cl. 307—88.5)

This invention relates to shift registers and, more particularly, to shift registers employing a tunnel diode and a reactive element for each stage wherein the diode of each stage is adapted to be operated bistably.

An article in the Physical Review for January, 1958, on pages 603–604, entitled, "New Phenomenon in Narrow Germanium P-N Junctions," by L. Esaki, describes a semiconductor structure which has become known as an "Esaki Diode"; sometimes alternately referred to in the literature and herein as a "tunnel diode." As described, this diode is a PN junction device in which the junction is very thin, i.e. narrow, in the current accepted terminology (150 A. or less), and in which the semiconductor materials on both sides of the junction have high impurity concentrations (of the order of $10^{19}$ net donor or acceptor atoms per cubic centimeter for germanium).

The tunnel diode is characterized by a very low reverse impedance, approaching a short circuit, with a forward potential-current characteristic exhibiting a negative resistance region beginning at a small value of forward potential and ending at a large forward potential. The potential value at the low potential end of the negative resistance region is very stable with respect to temperature and does not vary over a range of temperatures from a value near zero degrees K. to several hundred degrees K. At potential values outside the limited range described above, forward resistance of the tunnel diode is positive. The tunnel diode is then considered to be a diode exhibiting an "n" type characteristic curve for a plot of current versus potential. For a more complete understanding of the structure and operational characteristics of the tunnel diode, reference is made to an article appearing in the Proceedings of the IRE, July 1959, pages 1201–1206 entitled, "Tunnel Diodes as High-Frequency Devices," by H. S. Sommers, Jr.

The negative resistance region in the plot of current versus potential characteristic of the tunnel diode described above enables this device to sustain two stable states of operation when proper bias and load conditions are applied thereto. The bistability of the ensuing configuration makes possible the storage of binary information.

According to the novel principles of this invention, different embodiments of circuits employing tunnel diodes adapted to be operated bistably and coupled to a reactive element are shown to achieve the function of binary transfer in construction of shift registers. More specifically, a plurality of stages are connected to one another wherein the transfer of information is controlled by means of an external clock pulse source. The clock pulse is employed to bias the tunnel diode of the stage to a first stable operating state, which may be defined as being at a point within a first region of the diode characteristic curve which is of positive resistance having a small potential value and large current value. During application of the clock pulse an information input signal operating conjointly therewith serves to switch the tunnel diode to a second stable operating state. The second stable state may be defined as being at a point beyond a second region of the diode characteristic, which is the negative resistance region, characterized by a relatively large potential value and small current. The reactive element, here an inductor, is connected in parallel with the tunnel diode and, as switching of the tunnel diode takes place, attains a high energization level. The pulse to this stage then terminates while that to the succeeding stage is activated by the source. The high energization level attained by the inductor is then dissipated and provides a current signal to the succeeding stage conjointly with the source to switch the tunnel diode of the succeeding stage to the second stable operating state. Since the tunnel diodes are dynamic bistably operated, in that they must be energized at all times to maintain one state or the other, use of a clock pulse source allows automatic resetting of the diodes.

In one embodiment, the tunnel diode is the only nonlinear element employed, and the individual circuits are bidirectional. In this embodiment, a three-phase clock system is employed to insure unilateral flow of information. In other embodiments, however, a second nonlinear device is included in each stage such as, for example, conventional diodes, Zener diodes, reverse breakdown diodes, emitter base diodes of transistors, to make each stage unilateral in nature thus necessitating only two stages per bit of information. It is possible to design each tunnel diode stage to give power gain and consequently each stage of the transfer circuits or shift registers are capable of driving several similar stages, providing multiple output operation. Similarly, multiple input operation can be employed making use of the threshold switching of each stage to perform summation logic.

Accordingly, it is a prime object of this invention to provide novel shift registers.

Another object of this invention is to provide novel shift registers employing a tunnel diode and a reactive element for each stage.

Still another object of this invention is to provide novel shift registers employing a tunnel diode and reactive element for each stage wherein each stage is pulse biased to operate the diode thereof in a first stable state.

The foregoing and other objects, features and advantages of the invention will be apparent from the following more particular description of preferred embodiments of the invention, as illustrated in the accompanying drawings.

Figure 1:
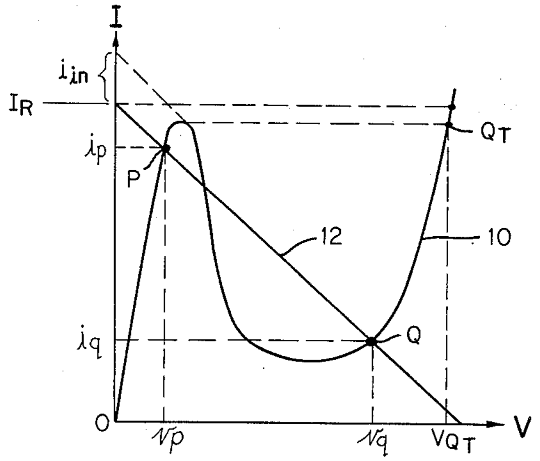
FIG. 1 is an illustration of a tunnel diode characteristic employed.

Referring to FIG. 1, a plot of current (I) versus voltage (V) for a typical tunnel diode is shown wherein a characteristic curve 10 may be defined as including a first region of increasing currents for increasing voltages and adjoining at a peak value of current a second region of negative resistance and thereafter a third region of positive resistance. It is this type characteristic which distinguishes the tunnel diode over other elements and which is utilized in the circuit of FIG. 2.

Figure 2:
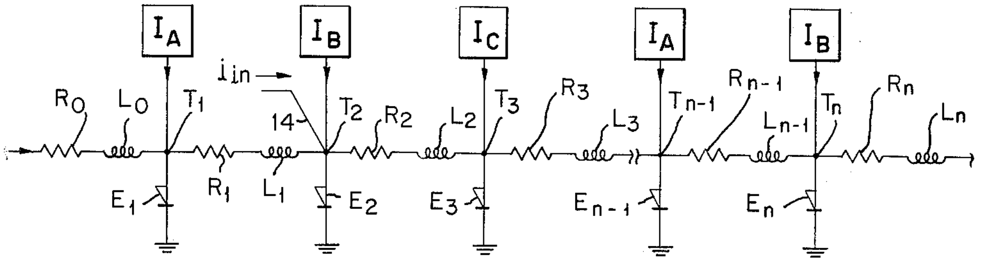
FIG. 2 illustrates one embodiment of this invention.

Referring to FIG. 2, one embodiment of this invention is shown wherein a number of similar stages are connected in tandem. Each stage of the circuit of FIG. 2 is provided with a tunnel diode E having one end connected to ground and the other connected to a terminal T. A circuit including a resistance R serially connected to an inductor L is shown connected parallel with the tunnel diode E and to the terminal T of the succeeding stage. Also provided is a clock pulse source $I_A$, $I_B$ and $I_C$ with the source $I_A$ energizing one stage, the source $I_B$ energizing a second succeeding stage and the source $I_C$ energizing a third succeeding stage. Each of the sources $I_A$, $I_B$ and $I_C$ is connected to the terminal T of their associated stages in parallel with the tunnel diode E and the serially connected resistor R and inductor L thereof. Information is entered into the circuit by any suitable means such as an information input line 14 connected to the terminal $T_2$ of the second stage. An information input line 14 is shown connected to the terminal $T_2$ of the second stage only for ease of presentation.

Figure 3:
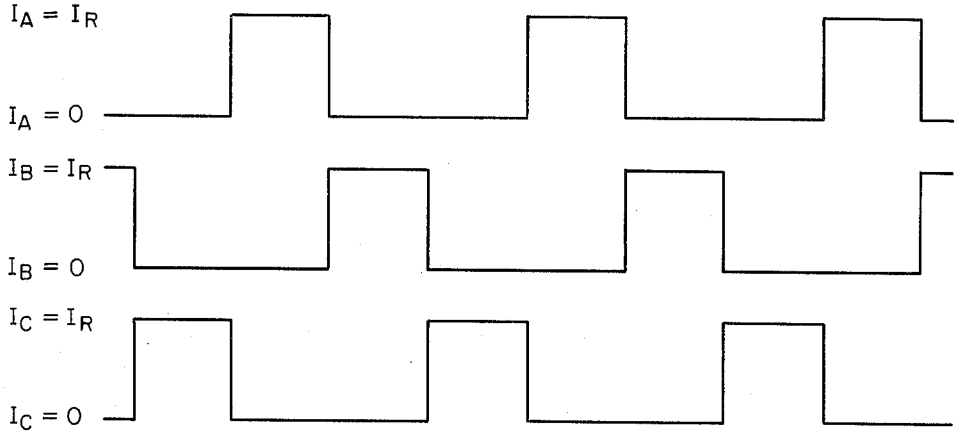
FIG. 3 is a plot of the relative clock pulses with respect to time, employed for operation of the embodiment of FIG. 2.

The pulse pattern for the various clock pulse sources $I_A$, $I_B$ and $I_C$ is shown in FIG. 3 and will be referred to in the subsequent detailed description of the circuit operation of FIG. 2.

Referring again to FIG. 1, each of the tunnel diodes E in the circuit of FIG. 2 have similar direct current I versus voltage V characteristics as described by curve 10. The resistance for each stage provides a load characteristic 12 to each of the diodes E. This resistance consists of the two coupling branches associated with each tunnel diode, e.g., for $E_2$ the two coupling branches are the series path $R_2$, $E_3$ and the series path $R_1$, $E_1$. (The resistors $R_1 \ldots R_n$ are much larger than the resistance of the tunnel diodes so that it is sufficient to consider the two coupling branches mentioned and neglect any further parallel loading.) It is apparent from FIG. 1 that the tunnel diode E has two D.C. stable operating points labelled P and Q maintaining a current $i_p$ at the voltage $v_p$ for the stable state P and a current $i_q$ at a voltage $v_q$ at the stable state Q. A bias current $I_R$ as shown in FIG. 1 is applied to the various stages of the circuit of FIG. 2 by means of the sources $I_A$, $I_B$ and $I_C$. The waveshapes and timing sequence of these current pulses are, as stated above, shown in FIG. 3. A three-phase system is employed to provide unilateral flow of information, since the individual stages of the circuit of FIG. 2 are in themselves bilateral elements, and as such can pass information in either direction.

Consider the tunnel diode $E_2$ at the time that $I_A=0$, $I_B=I_R$ and $I_C=0$. The operating point for tunnel diode for $E_2$ will be at P and the majority of the current $I_R$ flows througs tunnel diode $E_2$ with correspoindingly small currents through inductor $L_1$ and $L_2$. When transients have died away, the current through inductor $L_2$ will be $$\frac{I_R-i_p}{2}$$

Whent the clock pulse $I_B$ terminates the source $I_C$ is applied and increases to the value $I_R$ to bias the tunnel diode $E_3$ to the P state. At this time, inductor $L_2$ will discharge to provide current through tunnel diode $E_3$; however the operating point P is designed such that the sum of the current $I_R$ and that provided by the discharge of inductor $L_2$ is insufficient to overcome switching threshold current of tunnel diode $E_3$. Therefore, the P state has been transferred from tunnel diode $E_2$ to tunnel diode $E_3$.

Consider now that at the time when $I_B=I_R$, a current input $i_{in}$ is applied to the input line 14 as shown in FIG. 2. The operating point for tunnel diode $E_2$ will follow curve 10 from P to the beginning of the negative resistance region. Upon reaching the negative resistance region, tunnel diode $E_2$ will switch, but as current cannot change instantaneously through inductors $L_2$ and $L_3$, the operating point goes to a transient state $Q_T$. When inductors $L_1$ and $L_2$ complete their transient response, the operating point for tunnel diode $E_2$ changes from $Q_T$ to Q. The potential appearing across tunnel diode $E_2$ is then $V_q$ and the current through the series branch $R_2$, $L_2$, $E_3$ is then $$\left(\frac{I_R-i_q}{2}\right)$$

Now, upon termination of the clock pulse $I_B$, the $I_C$ clock source provides current to bias thet unnel diode $E_3$ to the value $i_p$, and the current through tunnel diode $E_3$ will approach the value $$i_p+\left(\frac{I_R-i_q}{2}\right)$$

due to the discharge current from the inductor $L_2$. This current is now sufficient to overcome the threshold switching current of tunnel diode $E_3$ when switches in the same manner as tunnel diode $E_2$ had switched. In this case, the Q state has been transferred from tunnel diode $E_2$ to tunnel diode $E_3$. This transfer circuit functions as a shift register when employed as described and requires three stages per bit of information. By making use of the threshold switching characteristic of the individual stages and by designing each stage to have power gain, summation or Kirchoff logic circuits can be constructed. Information flow and the resetting of each stage to the P stage is accomplished with the three-phase current pulse system.

Figure 5:
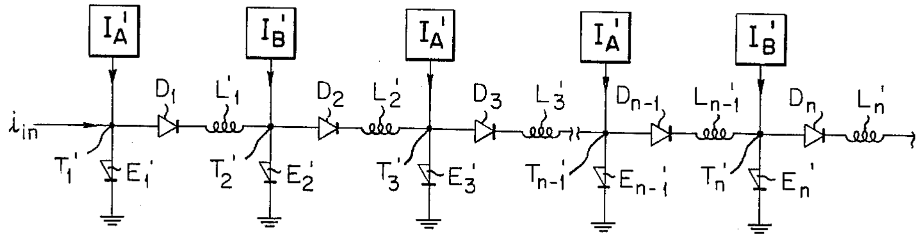
FIG. 5 is an illustration of another embodiment of this invention.

Referring now to FIG. 5, another embodiment of a shift register in accordance with this invention is shown. Again a series of similar stages are shown connected in tandem each stage having associated therewith a tunnel diode E′, an inductor L′ and a conventional diode D. The tunnel diode E′ of each stage has one end thereof connected to ground and the other to a terminal T′. Also connected to the terminal T′ is the diode D serially connected to the inductor L′ with the inductor L′ of each stage further connected to the terminal T′ of the next succeeding stage of the register. A clock pulse source $I_A'$ and $I_B'$ is provided with each source designated to energize alternate stages of the register and connected to the terminal T′ thereof.

Figure 4:
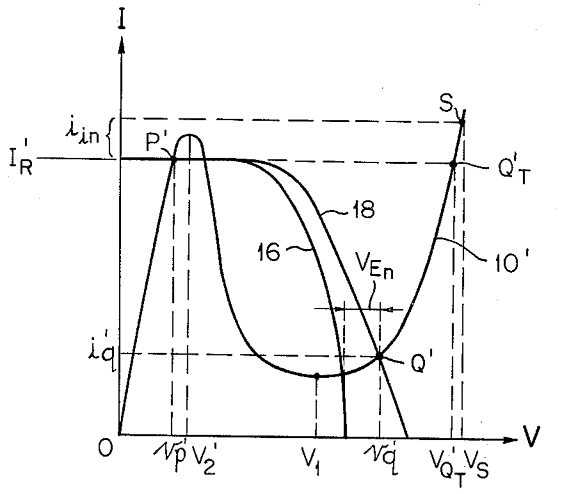
FIG. 4 is another illustration of the tunnel diode employed.
Figure 6:
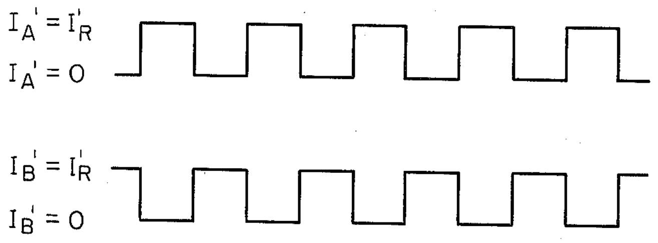
FIG. 6 is a plot, with respect to time, of the various clock pulses employed in operation of the embodiment of FIG. 5.

Referring to FIG. 4, the potential-current characteristics for each of the tunnel diodes E′ are shown depicting a curve 10′, similar to the curve 10 of FIG. 1. The load on each tunnel diode E′ in the circuit of FIG. 5 consists of a parallel branch including the conventional rectifying diode D, the inductor L′ and the succeeding tunnel diode. Thus, in FIG. 5, tunnel diode $E_1'$ is loaded with diode $D_1$, inductor $L_1'$ and tunnel diode $E_2'$. A curve 16 in FIG. 4 represents the load characteristic of the diode D alone, while a curve 18 is shown which represents the load characteristic of the diode D and the series resistance of the succeeding tunnel diode E′ which intersects the tunnel diode characteristic 10′ at points P′ and Q′. The operating point Q′ shows a current value of $i_q'$ with a voltage of $v_q'$ whereas the operating point P′ shows a potential $v_p'$ for a current value of $I_R'$, where $I_R'$ is the magnitude of the current provided by clock pulse sources $I_A'$ and $I_B'$. Thus, the load characteristic 18 is shown as a non-linear load line and, because of the rectifying characteristic of the diodes $D_1$ through $D_n$, the individual stages of the shift register are unilateral devices. The three-phase clock system employed in the circuit of FIG. 2 is, therefore, unnecessary. Instead, a two-phase clock system is employed whose function is to control information flow and to reset each of the stages. The waveshapes and relative timing sequence of the clock pulse sources $I_A'$ and $I_B'$ are as shown in FIG. 6 and will be referred to in the subsequent description of the circuit operation of FIG. 5.

Consider operation of the circuit of FIG. 5 when $I_A'=I_R'$, and $I_B'=0$. The tunnel diode $E_1'$ will be in its P′ state with diode $D_1$ in a region of very high resistance. Therefore, there is essentially no current flow through inductor $L_1'$ and tunnel diode $E_2'$. The diode $D_2$ is similarly in a high resistance region and conducts no current. When the clock pulse source $I_B'$ equals the value $I_R'$ and $I_A'$ terminates, the tunnel diode $E_2'$ goes to the P' state and there is no discharge current from inductor $L_1'$.

Consider now that at the time $I_A'=I_R'$, $I_B=0$, a current $i_{in}$ is applied to the terminal $T_1$, of the first stage as shown in FIG. 5. The magnitude of $i_{in}$ is such that the sum current through tunnel diode $E_1'$ is sufficient to overcome its threshold. All of the current $i_{in}$ will flow through tunnel diode $E_1'$ because diode $D_2$ is in a high resistance region of its characteristic. The operating point for tunnel diode $E_1'$ will switch to a point S on the curve 10' of FIG. 4, and when $i_{in}$ terminates the operating point recedes to a point $Q_T'$. When the transient response of inductor $L_1'$ is complete, the operating point then moves from $Q_T'$ toward Q', the intersection of curve 18 and curve 14. The resultant voltage across tunnel diode $E_1'$ is then $v_q'$ as shown in FIG. 5. The current through inductor $L_1'$ is now $I_R'-i_q'$ and this current flows through tunnel diode $E_2'$ causing a voltage to appear across it. When the clock pulse source $I_B'$ goes to $I_R'$ and $I_A'$ terminates, inductor $L_1'$ will discharge and force current through tunnel diode $E_2'$ which, when added to the clock pulse $I_B'$, will switch tunnel diode $E_2'$ and when the transient response of inductor $L_2'$ is complete tunnel diode $E_2'$ will be established in its Q' state. The Q' state is then shifted one position to the right in a similar manner each time the clock pulse sources $I_A'$ and $I_B'$ change phase.

Figure 7:
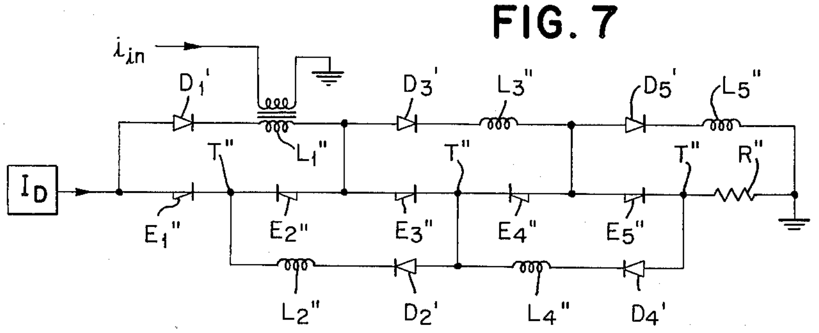
FIG. 7 illustrates still another embodiment of this invention.

Referring now to FIG. 7, another embodiment of this invention is shown wherein only a single clock pulse source $I_D$ is required for information transfer. More specifically, different pairs of tunnel diodes E'' are connected head-to-head with a circuit in parallel with each said pair comprising a diode D' serially connected to an inductor L''. A similar circuit is also provided connected between a terminal T'' located intermediate each said pair of tunnel diodes E'' and further, the last diode E'' of the last pair of diodes described above is replaced with a resistor R'' and the circuit is then terminated to ground. Each of the tunnel diodes E'' of the circuit have similar potential-current characteristics, as is shown in FIG. 8 described by characteristic curve 10''.

Figure 8:
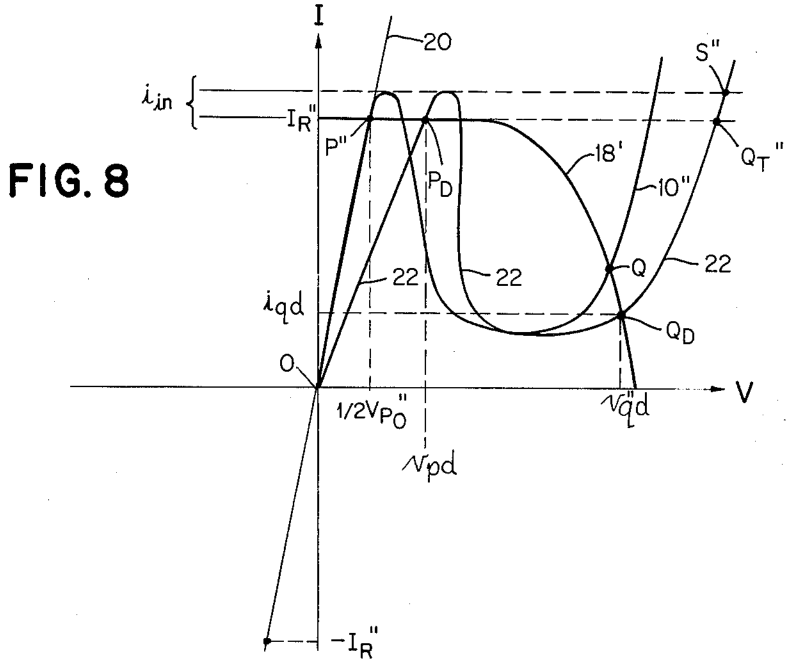
FIG. 8 illustrates the characteristics of the tunnel diodes as employed in the embodiment of FIG. 7.

Referring to FIG. 8, the D.C. characteristic for each tunnel diode E'' is similar to that described in FIG. 4; a non-linear load characteristic curve 18' intersects the tunnel diode E'' characteristic curve 10'' at points P'' and Q''. A curve 20 is also shown which is linear. The tunnel diode E'' appears as pure resistance in the region of coincidence of curve 20 and curve 10'' and consequently the curve 20 represents the current-potential curve of a resistor.

Figure 9:
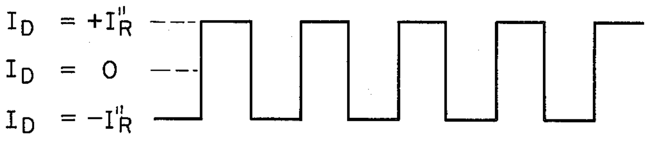
FIG. 9 is a plot, with respect to time, of the source employed in the embodiment of FIG. 7.

The clock source $I_D$ which energizes the circuit of FIG. 7 is shown in FIG. 7 with its waveform and timing described in FIG. 9. Referring to FIG. 9, the positive magnitude of $I_D$ is referred to as equal to $+I_R''$ while the negative excursion is referred to as equal to $-I_R''$ with the references $+I_R''$ and $-I_R''$ shown in the FIG. 8.

Referring again to the circuit of FIG. 7, assume that the source $I_D$ is at the value $+I_R''$ providing current flow into the mode of the tunnel diode $E_1''$ and the diode $D_1'$. Since the diodes $D_2'$ and $D_4'$ are reverse biased at this time, there is no current flow through $L_2''$, $D_2'$, $L_4''$ and $D_4'$. The current through the tunnel diodes $E_2''$ and $E_4''$ is such that they are reverse biased and therefore the tunnel diodes $E_2''$ and $E_4''$ appear as linear resistors. The load on tunnel diode $E_1''$ is then this series resistance of tunnel diode $E_2''$ and the parallel combination of the current source $+I_R''$ and the leg $D_1'$, $L_1''$. Shown in the FIG. 8, is a curve 22 which depicts the curve of the tunnel diode $E_1''$ in series with the reverse biased resistance of tunnel diode $E_2''$. The load of diode $D_1'$ and inductor $L_1''$ is then shown superimposed upon the curve 22 with intersection occurring at points $P_D$ and $Q_D$. The resistance R in the circuit allows the tunnel diode $E_5''$ to appear identical to previous stages. The current and voltage magnitudes for the point $P_D$ is defined by $I_R''$ and $v_{pd}$ while the point $Q_D$ is defined by $i_{qd}$ and $v_{qd}$.

With the current $+I_R''$ flowing, the tunnel diodes $E_1''$, $E_3''$ and $E_5''$ will be at the point $P_D$ and essentially no current can flow through diodes $D_1'$, $D_3'$ and $D_5'$ because they are in a region of high resistance. Tunnel diodes $E_2''$ and $E_4''$ are at the operating point defined by $-I_R''$ and diodes $D_1'$ and $D_4'$ can conduct no current because they are conventional rectifying diodes which are reversed biased.

If now the current generator changes to $I_D=-I_R''$, the direction of current flow will reverse in the circuit, creating similar conditions with tunnel diodes $E_2''$, $E_4''$ in the $P_D$ state, and tunnel diodes $E_1''$, $E_3''$ and $E_5''$ reverse biased so that there is no current flow through any of the conventional diodes D'.

Now suppose that at the time $I_D=+I_R$, the tunnel diode $E_1''$ is switched to point S''. The switching of tunnel diode $E_1''$ is accomplished by introducing a circulating current into the loop $E_1''$, $E_2''$, $L_1''$, $D_1'$. This circulating current is of a magnitude of not less than the value $i_{in}$ shown in FIG. 8 and its direction is such as to add to the current $+I_R''$. The current $i_{in}$ may be introduced in any of a number of ways, one of which is shown in FIG. 7 and consists of transformer coupling through the inductor $L_1''$.

With the operating point of tunnel diode $E_1''$ initially at S'' this operating point moves to point $Q_T''$ after $i_{in}$ terminates and the voltage across diode $D_1'$ is sufficient to allow current flow, charging $L_1''$ to a current level of $I_R''-i_{qd}$ thereafter leaving $E_1''$ in its $Q_D$ state. The diodes $D_3'$ and $D_5'$ are still in a high resistance region, so the current $+I_R''$ flows through tunnel diodes $E_3''$, $E_4''$ and $E_5''$ leaving them unchanged. When $I_D$ reverses to $-I_R''$, tunnel diodes $E_1''$, $E_3''$ and $E_5''$ will be reset and tunnel diodes $E_4''$ will go to the $P_D$ state. The indicator $L_1''$ will discharge through tunnel diodes $E_2''$, adding to the current $-I_R''$ to switch tunnel diode $E_2''$ to its S'' state and finally to its $Q_D$ state. The $Q_D$ state will shift to the right upon successive reversals of $I_D$.

The inductors L'', which perform temporary storage, could be replaced by capacitors with a corresponding change in the clock pulse system. In this case the successive tunnel diodes in the chain of circuits are placed in their circuits in alternately opposite polarities and the clock pulses applied are of alternately opposite polarity such that each tunnel diode is forward biased when its clock pulse becomes active. The coupling capacitors are charged during the time that the tunnel diode which they load is in its high voltage state. When this diode is turned off through the termination of its current clock pulse, the capacitor discharges, forcing current to flow in the opposite direction to that current which charged it. This discharge current flows in the next succeeding tunnel diode, and as the succeeding tunnel diode is placed in the opposite polarity to the first, the reversal of current direction through the capacitor is in a direction which adds to the bias current of the second tunnel diode and switches it. A disadvantage of this means of temporary storage is that the complements of the multiphase clock pulse systems discussed above are necessary.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A serial shifting register comprising a plurality of stages connected in tandem, each stage comprising a tunnel diode adapted to be operated in a first and a second stable state when said each stage is energized and a reactive impedance, a clock pulse source for successively energizing each of said stages in phase sequence, means connecting said reactive impedance of said each stage in series arrangement with the diode of the next succeeding stage and said series arrangement in parallel with the diode of said each stage, and means for applying an input pulse to one of said stages while energized by said corresponding clock pulse source to cause the diode of said one stage to switch to said second stable state and store energy in the corresponding reactive impedance, said corresponding reactive impedance operative upon termination of said corresponding clock pulse source to supply a current pulse to said next succeeding stage conjointly with the operation of the clock pulse source of said next succeeding stage, said current pulse being at least sufficient to switch the tunnel diode of said next succeeding stage when energized to the second stable state.

2. A serial shift register comprising a plurality of stages connected in tandem, each stage comprising a tunnel diode adapted to be operated in a first and a second stable state when said each stage is energized, said each stage further comprising a resistor and an inductor associated with said tunnel diode, means connecting said resistor and inductor of said each stage in series arrangement with the tunnel diode of the next succeeding stage and said series arrangement in parallel with said tunnel diode of said each stage, a separate clock pulse source connected to each of said stages and operative to successively bias in phase sequence corresponding tunnel diodes therein in said first stable operating state, and means for applying an input pulse to one of said stages conjointly with the operation of the clock pulse connected to said one stage to cause the tunnel diode therein to switch to said second stable operating state and cause the inductor therein to attain a high energization level, said inductor being operative to supply energy to said next succeeding stage of said register upon termination of the clock pulse source connected to said one stage and conjointly with the operation of the clock pulse source connected to said next succeeding stage to switch the tunnel diode of said next succeeding stage to said second stable state.

3. A shift register having a plurality of stages, each of said stages comprising a tunnel diode adapted to be operated in a first and a second stable state, when said each stage is energized a linear impedance element and a reactive element, and means connecting the linear and reactive elements in series arrangement with the tunnel diode of a next adjacent stage and said series arrangement in parallel with said tunnel diode of said each stage, means for successively energizing the stages of said register in phase sequence and operative to bias the tunnel diodes therein in said first stable state, and signal input means for energizing one of said stages conjointly with said energizing means to switch the tunnel diode therein to said second stable state whereupon the reactive element thereof attains a high energization level, the energy of said reactive element being dissipated during energization of said next adjacent stage by said energizing means to cause the tunnel diode therein to switch to said second stable operating state.

4. A shift register comprising a plurality of stages connected in tandem, each stage comprising a tunnel diode adapted to be operated in a first and a second stable state, a linear impedance element and a reactive element associated with said tunnel diode, means connecting the linear and reactive elements in series with said tunnel diode, said last means further connecting the series connected elements of each stage in series with the tunnel diode of the next succeeding stage, a first, a second, and a third clock pulse source for providing a series of pulses displaced in time, means connecting said clock pulse sources to succeeding stages of said register adapted to pulse bias the tunnel diodes thereof to the first stable operating state when operated, and signal input means for energizing one stage of said register conjointly with the clock pulse source thereof to cause the tunnel diode to switch to the second stable state and the reactive element thereof to attain a high energization level, the reactive element of said one stage thereafter adapted to provide a signal to the succeeding stage of said register conjointly with the energization of said succeeding stage by said clock pulse sources.

5. A device having a plurality of stages, each of said stages comprising a tunnel diode adapted to be operated in a first and a second stable state when said each stage is energized and a reactive impedance connected to said tunnel diode and adapted to store energy upon switching of said tunnel diode from said first to said second stable state, the reactive impedance in each of said stages being serially connected to the tunnel diode in a next succeeding stage, means for successively energizing each of said stages in phase sequence to bias the tunnel diodes therein in said first stable state, means for applying an input pulse to one of said stages while energized by said energizing means to switch the tunnel diode therein to said second stable state, dissipation of energy stored in the reactive impedance upon switching of the tunnel diode in each of said stages being sufficient to switch the tunnel diode in the next succeeding stage to said second stable state when the next succeeding stage is energized by said energizing means.

6. A shift register having a plurality of stages, each of said stages comprising a tunnel diode adapted to be operated in a first and second stable state when said each stage is energized, an asymmetrical impedance device and a reactive impedance element associated with the tunnel diode, and means for connecting the asymmetrical impedance device and the reactive impedance element in said each stage in series arrangement with the tunnel diode in a next succeeding stage and said series arrangement in parallel with the tunnel diode in said each stage, means for successively energizing each of said stages of said register in phase sequence to bias the tunnel diodes therein in the first stable state, and signal input means for energizing one of said stages concurrently with said energizing means to cause the tunnel diode in said one stage to switch to the second stable state, the reactive impedance element in said each stage attaining a high energization level upon switching of the tunnel diode therein and providing an input signal to said next succeeding stage upon energization thereof by said energizing means to switch the tunnel diode therein to the second stable state.

7. A shift register comprising a plurality of stages connected in tandem, each stage comprising a tunnel diode adapted to be operated in a first and a second stable state when said each stage is energized, a non-linear impedance element and a reactive element associated with the tunnel diode, and means for connecting said elements in series arrangement with the tunnel diode in the next succeeding stage, said last means further connecting said series arrangement in parallel with the tunnel diode in said each stage, a source of clock pulses for successively energizing each of the stages of said register in phase sequence to bias the tunnel diode therein to the first stable state, and signal input means for energizing one of said stages concurrently with said energizing means to cause the tunnel diode therein to switch to the second stable state, the reactive element in said each stage adapted to attain a high energization level upon switching of the tunnel diode therein, the reactive element in said each stage thereafter adapted to provide a signal input to said next succeeding stages concurrently with the energization thereof by said energizing means.

8. A serial shift register comprising a plurality of stages connected in tandem, each stage comprising a tunnel diode adapted to be operated in a first and a second stable state when said each stage is energized, an asymmetrical impedance element and a reactive element connected to the tunnel diode, a source of clock pulses for successively energizing each of said stages in phase sequence to cause operation of the tunnel diode therein in the first stable state, means for connecting the reactive element of said each stage in series with the tunnel diode and impedance element of the next succeeding stage, and means for applying an input signal to one of said stages concurrently with the energization thereof by said energizing means to cause the tunnel diode in said one stage to switch to the second stable state and temporarily store energy in the reactive element in said one stage, said reactive element in said one stage being operative to supply a current pulse to said next succeeding stage concurrently with the energization thereof by said energizing means to switch the tunnel diode therein to the second stable state.

9. A serial shift register comprising a plurality of stages connected in tandem, each stage comprising a tunnel diode adapted to be operated in a first and a second stable state when said each stage is energized, a non-linear resistive element and a reactive element connected to said tunnel diode, and clock pulse means for successively energizing each of said stages in phase sequence to bias the tunnel diode therein in the first stable state, means for connecting the reactive element in said each stage with the tunnel diode and resistive element in the next succeeding stage, and means for applying an input signal to one of said stages concurrently with the energization thereof by said clock pulse means to cause the tunnel diode therein to switch to the second stable state and temporarily store energy in the reactive element in said one stage, said reactive element in said one stage being operative to provide a current pulse to the next succeeding stage concurrently with the energization thereof by said clock pulse means to switch the tunnel diode therein to the second stable state.

References Cited by the Examiner

UNITED STATES PATENTS

| | | | |
|---|---|---|---|
| 2,522,402 | 9/50 | Robertson | 307—88.5 |
| 2,585,571 | 2/52 | Mohr | 307—88.5 |
| 2,614,141 | 10/52 | Edson et al. | 307—88.5 |
| 2,912,598 | 11/59 | Shockley | 307—88.5 |
| 2,933,620 | 4/60 | Huang | 307—88.5 |
| 2,944,164 | 7/60 | Odell et al. | 307—88.5 |
| 2,975,377 | 3/61 | Price et al. | 307—88.5 |
| 2,986,724 | 5/61 | Jaeger | 307—88.5 |
| 3,033,714 | 5/62 | Ezaki et al. | 317—234 |
| 3,062,971 | 11/62 | Wallace | 307—88.5 |
| 3,096,445 | 7/63 | Herzog | 307—88.5 |

OTHER REFERENCES

Article: "Tunnel Diodes as High-Frequency Devices," by Sommers, Jr., Proceedings of IRE, July 1959, pages 1202–1206.

Article: "The Tunnel Diode-Circuits and Applications," Electronics, November 27, 1959, pages 60 to 64.

JOHN W. HUCKERT, *Primary Examiner.*

HERMAN KARL SAALBACH, *Examiner.*